United States Patent [19]
Prater

[11] Patent Number: 5,574,633
[45] Date of Patent: Nov. 12, 1996

[54] MULTI-PHASE CHARGE SHARING METHOD AND APPARATUS

[75] Inventor: James S. Prater, Fort Collins, Colo.

[73] Assignees: AT&T Global Information Solubions Company, Dayton, Ohio; Hyundai Electronics America, San Jose, Calif.; Symbios Logic Inc., Fort Collins, Colo.

[21] Appl. No.: 200,612

[22] Filed: Feb. 23, 1994

[51] Int. Cl.$^6$ .............................. H02M 3/18; H02M 7/25; H02M 3/06; H01M 10/44
[52] U.S. Cl. .................. 363/59; 307/109; 320/1
[58] Field of Search .................... 307/109, 110, 307/412, 417, 409; 320/1; 363/59, 60, 61; 326/26, 27

[56] References Cited

U.S. PATENT DOCUMENTS

| | | | |
|---|---|---|---|
| 3,601,634 | 8/1971 | Ebertin | 307/251 |
| 3,603,898 | 9/1971 | Dawson | 333/70 |
| 4,535,259 | 8/1985 | Smarandoiu et al. | 307/530 |
| 4,638,187 | 1/1987 | Boler et al. | 307/451 |
| 4,829,199 | 5/1989 | Prater | 307/443 |
| 4,864,164 | 9/1989 | Ohshima et al. | 307/443 |
| 4,906,867 | 3/1990 | Petty | 307/443 |
| 4,947,228 | 8/1990 | Gabara | 357/42 |
| 4,947,376 | 8/1990 | Arimoto et al. | 365/205 |
| 4,983,860 | 1/1991 | Yim et al. | 307/443 |
| 4,985,641 | 1/1991 | Nagayama et al. | 307/272.3 |
| 5,095,223 | 10/1992 | Thomas | 307/110 |
| 5,121,000 | 6/1992 | Naghshineh | 307/443 |
| 5,159,210 | 10/1992 | Eitrheim et al. | 307/480 |
| 5,173,755 | 12/1992 | Co et al. | 257/361 |
| 5,204,558 | 4/1993 | Kumaki et al. | 307/475 |
| 5,317,206 | 5/1994 | Hanibuchi et al. | 307/443 |
| 5,367,210 | 11/1994 | Lipp | 326/26 |
| 5,367,645 | 11/1994 | Lubeck et al. | 395/325 |

*Primary Examiner*—Peter S. Wong
*Assistant Examiner*—Bao Q. Vu
*Attorney, Agent, or Firm*—Wayne P. Bailey

[57] ABSTRACT

A multi-phase charge sharing technique for electrical and electronic circuits. During a first phase, I/O drivers for circuit outputs that are to change value are deactivated. During a second phase, a plurality of circuit outputs are connected together to allow for charge transfer between higher voltage outputs and lower voltage outputs. Since the output nodes generally have capacitive loads, the common connection of high voltage nodes with low voltage nodes results in charge equilibrium, where the voltage on each commonly connected node acquires the same voltage. As existing charge from high voltage nodes is being used to charge lower voltage nodes, the lower voltage nodes are partially charged without requiring additional external power. Following this charge transfer, the outputs are disconnected from one another and operated in their normal fashion. Thus, output values that are changing from a low to a relatively higher voltage are partially boosted to a higher voltage level from existing high voltage sources on other circuit outputs. This reduces the amount of power which is required to drive the output node to a subsequent voltage level. Similarly, output values that are changing from a high to a relatively lower voltage are partially discharged by existing low voltage output nodes. The partial discharging of these nodes results in a reduction in ground bounce.

20 Claims, 5 Drawing Sheets

1

MULTI-PHASE CHARGE SHARING METHOD AND APPARATUS

TECHNICAL FIELD

The present invention relates to techniques for the minimization of power used in electrical or electronic circuits, and more specifically to a method and apparatus for sharing charge between electrical or electronic circuits.

BACKGROUND OF THE INVENTION

Electrical circuits, such as logic and memory circuits, typically have output voltage values which convey information regarding the functionality and results of the particular circuit. For digital circuits, a high voltage level might indicate a logical ONE value, whereas a low voltage level might indicate a logical ZERO value. Maintaining and changing these output voltage levels results in power dissipation, as is commonly known in the art.

Particularly in the digital electronic art, many types of circuits operate synchronously, where several outputs can switch or otherwise change values at the same time. This synchronous operation generally results from a common clock or other control signal being used to initiate or trigger the change in output. For such a system, the amount of power required to support instantaneous switching can be significant.

The simultaneous switching of large numbers of circuit outputs also generates a substantial amount of heat, which must be removed or dissipated. This adds to the overall cost of the system, by either requiring some type of heat sink or by not providing other functions that might otherwise be included within the same electrical/electronic device packaging.

In addition, such simultaneous switching increases the amount of ground bounce which may potentially occur in the system. Although ideally the ground voltage remains at zero volts, certain transient voltage spikes can appear on the ground signal when switching large voltages or currents to ground. These transient voltage spikes, also known as ground bounce, can cause operational errors in, and/or physical damage to, the electrical/electronic devices.

SUMMARY OF THE INVENTION

It is an object of the present invention to minimize power dissipation in an electrical or electronic circuit.

It is yet another object of the present invention to reduce the amount of ground bounce in an electrical or electronic circuit.

It is still a further object of the present invention to provide a method and apparatus for sharing charge between differing electrical/electronic circuits.

A plurality of electrical/electronic circuits have voltages on their output nodes as a result of normal circuit operation. During such normal operation, it is often desired or required to change, or switch, the output voltages appearing on at least one of the circuit outputs. The present invention is directed to this output switching operation. A multi-phase charge sharing technique is used. During a first time period, or phase, I/O drivers for circuit outputs that are to change value are deactivated. During a second time period, these circuit outputs are connected together to allow for charge transfer between higher voltage outputs and lower voltage outputs. Since the output nodes generally have capacitive loads, the common connection of high voltage nodes with low voltage nodes results in charge equilibrium, where each commonly connected node acquires substantially the same voltage. As existing charge from high voltage nodes is being used to charge lower voltage nodes, the lower voltage nodes are partially charged without requiring additional external power. Following this charge transfer, the outputs are disconnected from one another and operated in their normal fashion (i.e. driven to a desired or resultant voltage levels). Thus, output values that are changing from a low to a relatively higher voltage are partially boosted to a higher voltage level using existing high voltage sources on other circuit outputs. This reduces the amount of power which is subsequently required to drive the output node to a desired or subsequent voltage level. Similarly, output values that are changing from a high to a relatively lower voltage are partially discharged by existing low voltage output nodes. The partial discharging of these nodes results in a reduction in ground bounce.

The foregoing, and other objects, features, and advantages of the present invention will become apparent from the following detailed description of the preferred embodiment when taken in conjunction with the accompanying drawing.

DETAILED DESCRIPTION OF THE PREFERRED EMBODIMENT

The present invention is a method and apparatus for reducing power consumption, and at the same time reducing ground bounce problems in electrical and electronic circuits. The preferred embodiment of the present invention is a semiconductor integrated circuit (IC) having output driver circuits used to drive I/O pads. These I/O pads are used to couple the IC's I/O signals to external conductors, pins or connectors, and typically use a large amount of power. This invention reduces such power consumption.

When a number of pads switch at the same time, as in a computer bus, some of the pads are transitioning from a logical ONE to a logical ZERO (i.e. from a +Vdd to ground voltage level) and some are transitioning from a logical ZERO to a logical ONE (i.e. from a ground to +Vdd voltage level). When using certain integrated circuit technologies such as CMOS, this is done by charging or discharging the capacitance attached to the I/O pad (i.e. the capacitance of external circuit board traces and inputs to other external chips). The present invention uses charge from a pad going from a logical ONE to a logical ZERO (i.e. discharging) to assist in charging a pad going from a logical ZERO to a logical ONE (i.e. charging).

Figure 5:
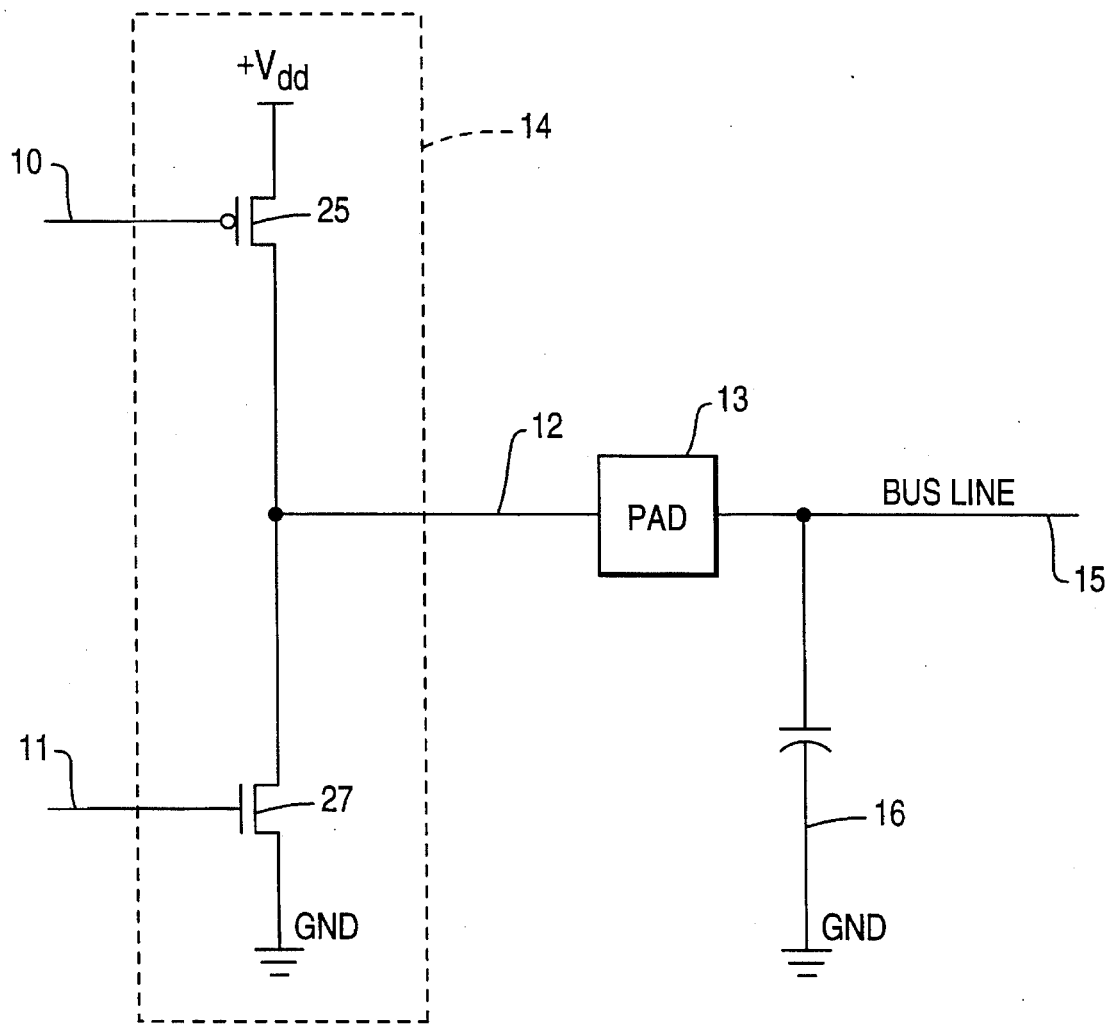
FIG. 5 is a traditional output driver circuit.

Referring initially to FIG. 5, there is shown a traditional I/O pad driver circuit 14. The driver circuit has input terminals 10 and 11 which receive signals from various circuits (not shown), and an output node 12 for producing output signals. This output node 12 is coupled to an I/O pad 13 for subsequent connection along bus line 15 to other external devices (not shown). These external devices, and conductors attaching thereto, have an effective capacitance that is represented by capacitive load 16 of FIG. 1. The pad driver circuit 14 comprises a pull-up transistor formed of a P-channel field effect transistor (P-FET) 25 and a pull-down transistor formed of an N-channel field effect transistor (N-FET) 27. Pull-up transistor 25 is connected between a power supply terminal +Vdd and output node 12. Pull-down transistor 27 is connected between a ground terminal and output node 12. The gate of pull-up transistor 25 is connected to input terminal 10. The gate of pull-down transistor 27 is connected to input terminal 11.

When a signal applied to input terminal 10 is a logical ZERO, pull-up transistor 25 is turned on; and conversely when a signal applied to input terminal 10 is a logical ONE, pull-up transistor 25 is turned off. In a similar fashion, but of opposite polarity, when a signal applied to input terminal 11 is a logical ONE, pull-down transistor 27 is turned on; and conversely when a signal applied to input terminal 11 is a logical ZERO, pull-down transistor 27 is turned off. Thus, a logical ZERO signal appearing at both of inputs 10 and 11 results in an output signal on output node 12 being a logical ONE (as it is driven to +Vdd by P-FET 25 being turned on and N-FET 27 being turned off). Similarly, a logical ONE signal appearing at inputs 10 and 11 results in an output signal on output node 12 being a logical ZERO (as it is driven to ground by N-FET 27 being turned on and P-FET 25 being turned off).

Figure 1:
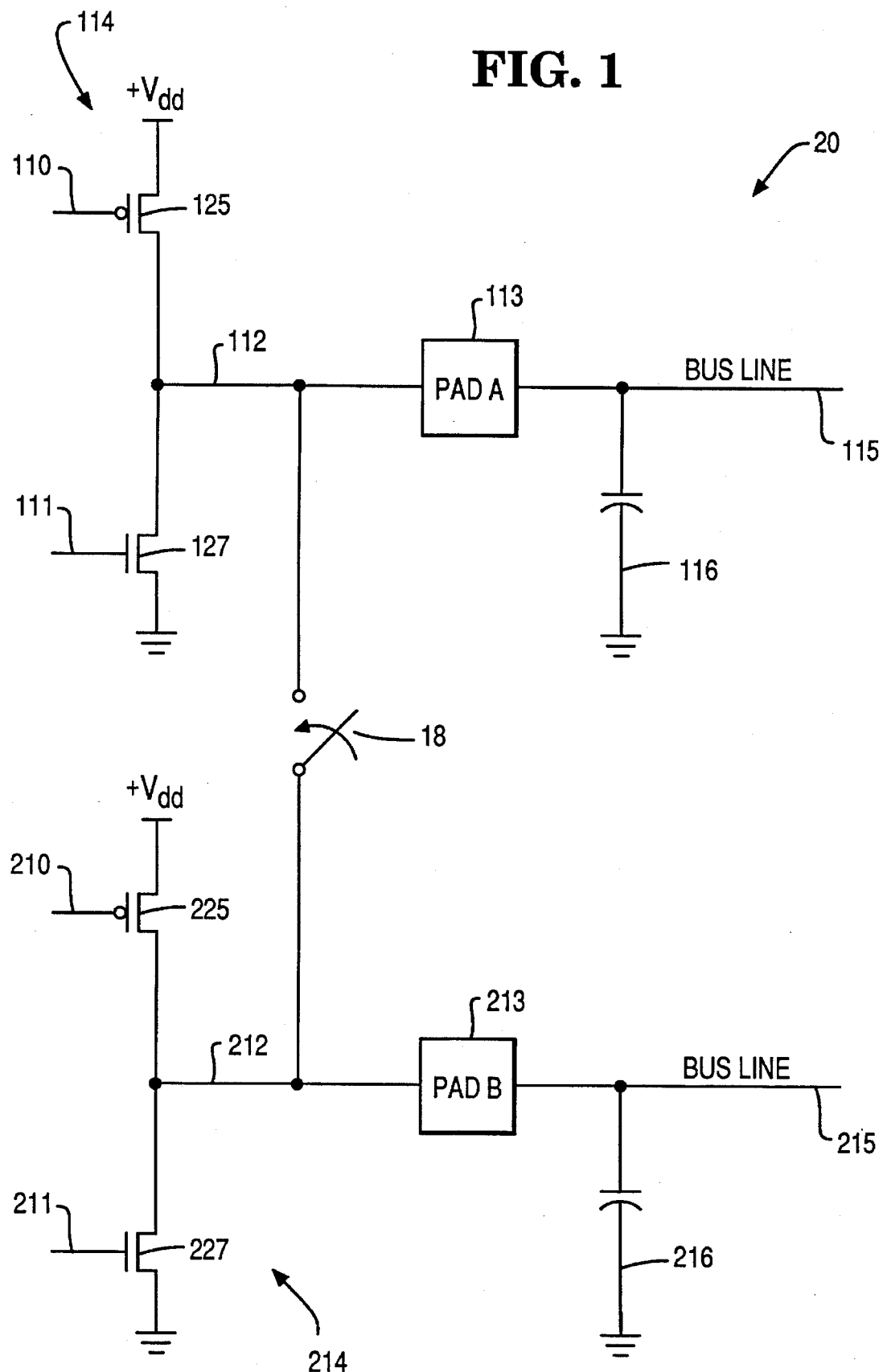
FIG. 1 shows the common connection of two output driver circuits.

A conceptual implementation of the multi-phase charge sharing apparatus 20 is shown in FIG. 1. The components similar common to the prior art circuit of FIG. 5 are indicated by similar reference numerals, but having a "1" or "2" prefix attached. Two I/O pads 113 and 213, Pad A and Pad B, are shown connected to respective bus lines 115 and 215. These bus lines provide electrical communication with other external devices (not shown), and have a capacitance 116 and 216, respectively, which represents the effective capacitance of the external devices and interconnecting conductors. Initially, each I/O pad 113 and 213 has a known logic state (the present state). Assume Pad A, and its associated bus line, is HIGH (i.e. a logical ONE) and Pad B is LOW (i.e. a logical ZERO). If the next state of Pad A should be LOW and Pad B should be HIGH, the pad drivers 114 and 214 need to discharge Pad A and charge Pad B. Normally this is done by connecting Pad A to ground through an N-FET 127 and connecting Pad B to power through a P-FET 225, as previously described with reference to FIG. 5. However, a switch 18 is now connected between Pad A and Pad B to help charge Pad B. To discharge Pad A and charge Pad B, the following operations are done.

During a first phase, the pad drivers 114 and 214 are turned off. This is accomplished via control signals presented at inputs 110, 111, 210 and 211, which are generated by control signal generator circuitry (not shown) using traditional techniques. For example, to disable P-FET devices 125 and 225, a logic ONE would be generated by the control signal generator circuit and presented to gate inputs 110 and 210 of the respective P-FET devices 125 and 225. In a similar manner, to disable N-FET devices 127 and 227, a logic ZERO would be generated by the control signal generator circuit and presented to the gate inputs 111 and 211 of the respective N-FET devices 127 and 227.

During a second phase, switch 18 is closed, allowing charge to flow from Pad A to Pad B. During this phase, the two pads (Pad A and Pad B) will come to the same voltage, roughly halfway between supply voltage +Vdd and ground.

During a third phase, switch 18 is opened and the pad drivers are turned back on (via control signals 110, 111, 210 and 211, to drive Pad A the rest of the way to logic ZERO (ground) and Pad B the rest of the way to logic ONE (+Vdd). In this case, half of the power required to charge Pad B is obtained by using the charge from Pad A (assuming the capacitance on Pads A and B is the same). Likewise, the amount of power delivered to the ground voltage supply by discharging Pad A is cut in half, which reduces ground bounce.

Figure 2:
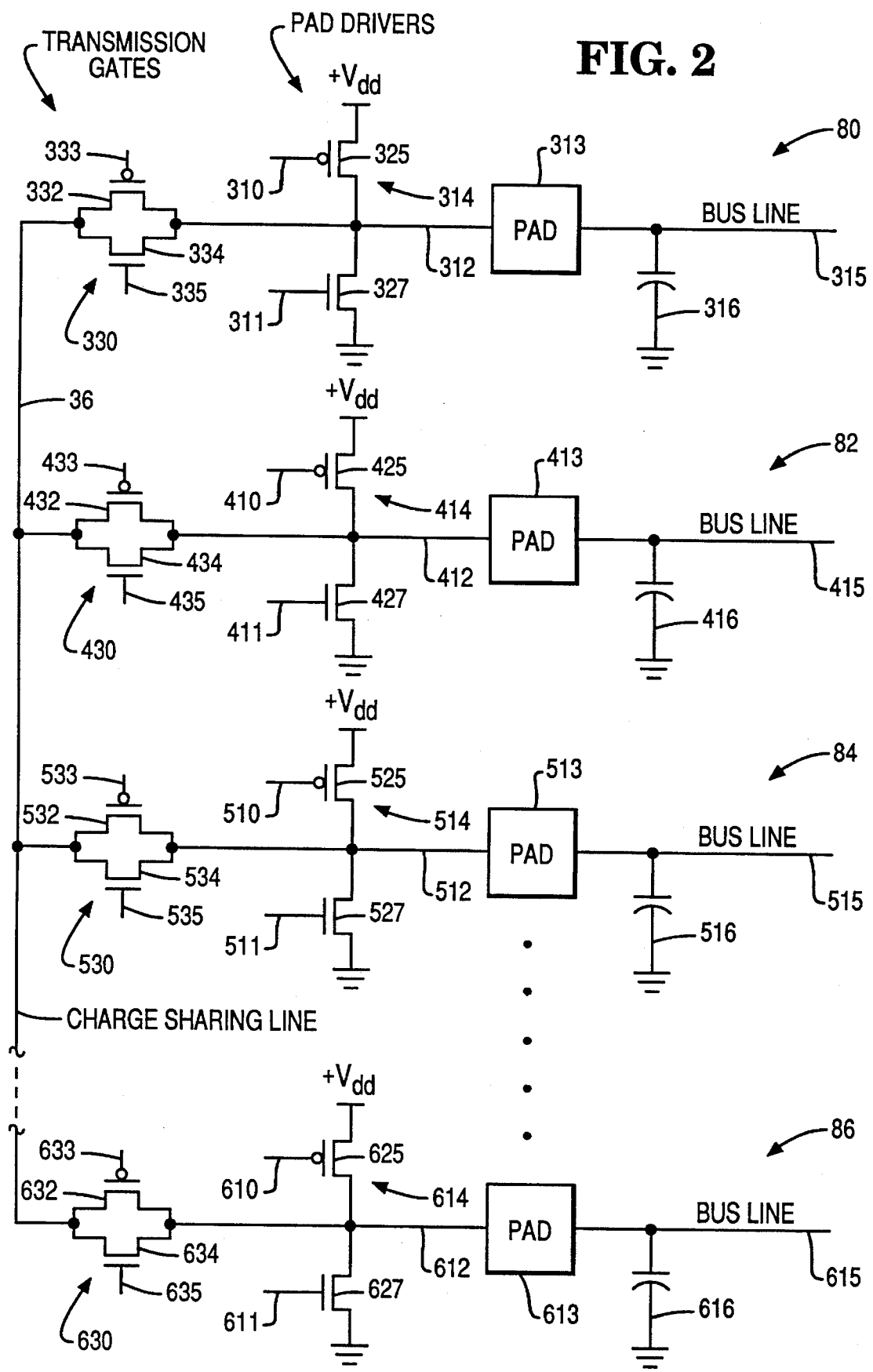
FIG. 2 shows a CMOS implementation for connecting a plurality of I/O pad driver circuits together using a charge sharing line.

An integrated circuit chip normally has many I/O pins, so a preferred implementation of the present invention takes advantage of this multiplicity of I/O pins by sharing charge between several I/O pads. Such an implementation is shown in FIG. 2, where the pad drivers (315, 414, 514 and 614), I/O pads (313, 413, 513 and 613) and capacitively loaded bus lines (315, 415, 515 and 615) all function in a similar manner as previously described with respect to FIG. 1. Additional features shown in FIG. 2 are the transmission gates 330, 430, 530 and 630 which perform a similar switching function as switch 18 of FIG. 1, and charge sharing line 36. Each transmission gate (e.g. 330) is comprised of a P-FET (e.g. 332) and N-FET (e.g. 334) transistor connected in parallel, with respective source and drain nodes of each pair of P-FET and N-FET devices connected together. One side of each transmission gate transistor pair 330, 430, 530 and 630 is coupled to the charge sharing line 36. The other side of each transmission gate transistor pair 330, 430, 530 and 630 is coupled to a respective output (e.g. 321) of the respective pad driver (e.g. 314). The transmission gates are turned on and off by control signals applied to gates (e.g. 333 and 335) of the respective P-FET (e.g. 332) and N-FET (e.g. 334) transistors. A logical ZERO applied to any of gates 333, 433, 533 and 633 will turn on the respective P-FET transistor, and hence couple the charge sharing line 36 with the respective pad driver. Similarly, a logical ONE applied to any of gates 335, 435 and 635 will turn on the respective N-FET transistor, and hence couple the charge sharing line 36 with the respective pad driver. In an alternate embodiment, a single FET transistor could be used for the transmission gate. However, the use of a single FET does not allow for full rail-to-rail voltage swings, due to the voltage drop Vt of approximately 0.7 to 0.9 volts between the gate and drain of a FET when the FET is turned on or active. By connecting two FETs of opposite type (e.g. P and N FETs) in parallel, a full rail-to-rail swing is possible.

Since transmission gates 330, 430, 530 and 630 all connect to the common charge sharing line 36, any I/O pad 313, 413, 513 or 613 transitioning from a logical ZERO to a logical ONE, or from a logical ONE to a logical ZERO, can share charge. In order to share charge, the pad drivers 314, 414, 514 and 614 are turned off during phase one for any pad that is transitioning, by applying appropriate control signal values at the respective gates (e.g. 310 and 311) of the pad drivers (e.g. 314). Next, the transmission gates are turned on during phase two for any I/O pads that are transitioning (i.e. changing voltage levels), by applying appropriate control signal values at their respective gates. The transitioning I/O pads share charge across the charge sharing line 36, and reach an equilibrium voltage (this equilibrium voltage depends both on the capacitance of each connected pad, and on which direction each pad is transitioning). Then, the transmission gates are turned off (via control signals such as 333 and 335 and the pad drivers are turned on (via control signals such as 310 and 311 during phase three to take the I/O pads the rest of the way to +Vdd or ground voltage, accordingly. I/O pads which are not transitioning are not connected to the charge sharing line 36, and their pad drivers stay on (i.e. enabled via their control signals such as 310 and 311) during the multi-phase charge transfer in order to hold their pad voltages at logic ONE or logic ZERO, accordingly.

Since the equilibrium voltage obtained when the transitioning pads are commonly connected across charge sharing line 36 is dependent upon pad capacitance 16 and direction of transition, as previously described, the amount of power saved by this implementation is pattern dependent. For example, assume similar pad capacitance values for each transitioning pad. If half the transitioning pads are going from a logical ONE to a logical ZERO (falling transition), and half the transitioning pads are going from a logical ZERO to a logical ONE (rising transition), the charge sharing line 36 will end up about halfway between +Vdd and ground voltage. For this case, approximately half the power would be required, as compared to a non-charge sharing system, to continue driving the rising transition pads to the resultant voltage level. For the falling transition pads, ground bounce is reduced as approximately half the power, as compared to a non-charge sharing system, is dissipated to ground.

However, if only a few I/O pads are going one way (e.g. a falling transition), and most are going the other way (e.g. a rising transition), the equilibrium voltage will be much closer to one rail voltage (e.g. ground) than the other rail voltage (e.g. +Vdd). For example, if two-thirds of the transitioning I/O pads are going from LOW to HIGH, and one-third of the transitioning I/O pads are going from HIGH to LOW, the equilibrium voltage would be approximately ⅓ Vdd volts (assuming equal capacitance for each pad). The amount of power required to continue driving the rising transition pads to the resultant Vdd volts is still reduced from that of a non-charge sharing system (since you only need to drive the rising transition nodes from ⅓ Vdd to Vdd volts, instead of from ground to Vdd volts), but is greater than the power required when the rising and falling transition pads were equal in number (where you only need to drive the rising transition nodes from ½ Vdd to Vdd volts). However, in this case, the amount of power to be dissipated to ground is reduced (since you only need to drive the falling transition nodes from ⅓ Vdd to ground), resulting in a greater reduction of ground bounce than when the rising and falling transition pads were equal in number (and where you need to drive the falling transition nodes from ½ Vdd to ground).

For the general case, the charge sharing line 36 voltage can be approximately determined as the sum of the total charge on those outputs which are commonly connected together, divided by the sum of the capacitance of those same outputs. For example, if three outputs are connected together, with one output transitioning from logical ONE to logical ZERO, and the other two outputs transitioning from logical ZERO to logical ONE, the voltage on the charge sharing line 36 will end up at:

$$V=(Vdd)(C\ output1)+(O)(C\ output2)+(O)(C\ output3)/(C\ output1+C\ output2+C\ output3+C\ internal)$$

where C internal is the capacitance associated with the charge sharing line 36, the transmission gates 30 and the pad drivers 14. C internal is usually much smaller than the load capacitance 16 of an output, so it can be neglected in this example. If each output is connected to a 50 picofarad load and Vdd=5.0 volts, the voltage on charge sharing line 36 is approximately:

$$V=(5)(50\ pF)+(O)(50\ pF)+(O)\ (50\ pF)/(50\ pF+50\ pF+50\ pF)=1.667\ volts$$

Note that if the capacitive values are dissimilar, the same calculation is used to determine the final charge sharing line voltage. For instance, in the previous example, if the output transitioning from logical ONE to logical ZERO is connected to a 50 picofarad load, and the other two outputs are connected to 25 picofarad loads, the voltage on charge sharing line 36 will end up at:

$$V=(5)(50\ pF)+(O)(25\ pF)+(O)\ (25\ pF)/(50\ pF+25\ pF+25\ pF)=2.5\ volts$$

Figure 3:
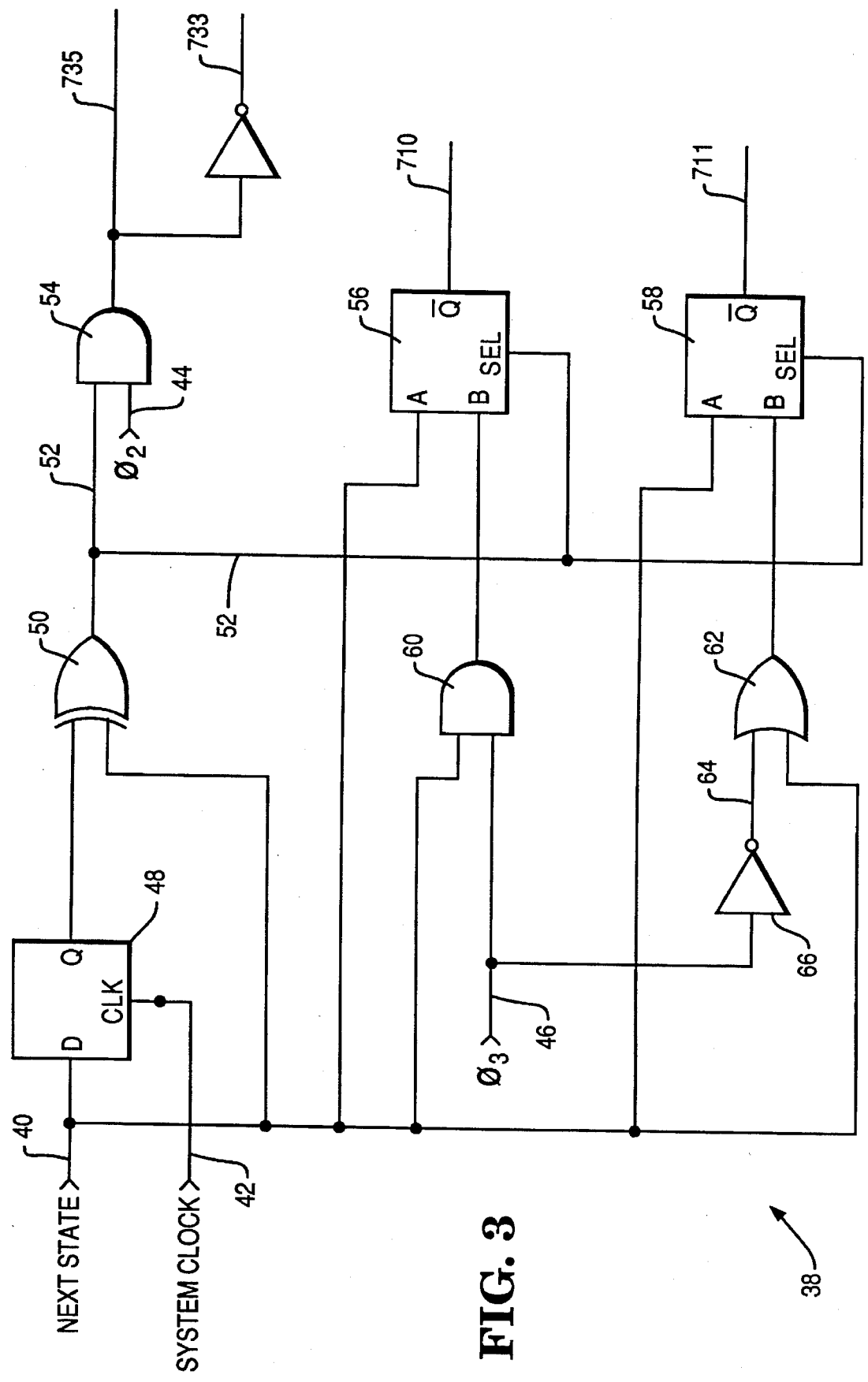
FIG. 3 is a control signal generation apparatus.
Figure 4:
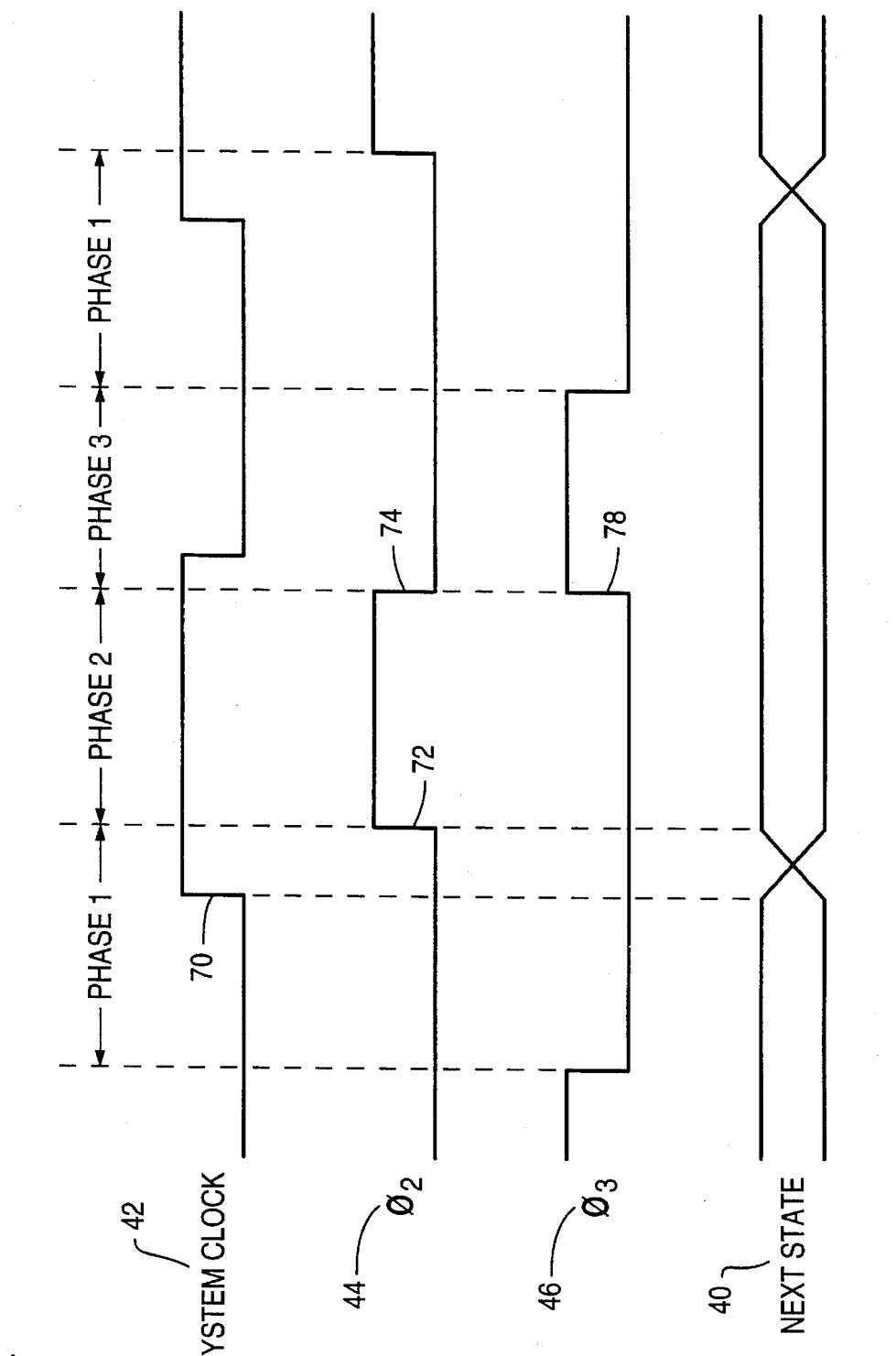
FIG. 4 is a timing diagram for clocking the control signal apparatus of FIG. 3.

FIGS. 3 and 4 show the preferred embodiment for providing the additional logic and clocking needed to control the transmission gates 30 and pad drivers 14 of FIG. 2. Numerous other techniques commonly known in the electronic control art could similarly be used, such as PLAs, PALs, ROMs, a programmed microcontroller, etc.

FIG. 3 shows a control circuit 38 having an input 40 for the next desired value, or state, for the particular I/O pad 13 to be driven. Three timing signals, with timings as shown in FIG. 4, are also inputs to control circuit 38 of FIG. 3. These timing signals are the system clock 42, phase 2 clock 44 and phase 3 clock 46. It should also be noted that the circuit of FIG. 3 is for a single I/O pad subsystem 80 (i.e. a single transmission gate transistor pair 30, a single pad driver transistor pair 14, and a single I/O pad 13). Similar equivalent circuits are preferably used for controlling each of the other I/O pad subsystems 82, 84 and 86 shown in FIG. 2.

Continuing with FIG. 3, the state of each I/O pad 13 must be held in a register 48 to compare at 50 with the next state 40 of the I/O pad, in order to determine if the pad is transitioning or not. Register 48 has coupled to its D input the next state or value of the respective I/O pad, and is clocked by system clock 42. The output of register 48 is coupled to one input of exclusive-OR gate 50. The other input of gate 50 is directly coupled to the next state 40 of I/O pad 13. Therefore, the exclusive-OR gate compares the previously clocked I/O pad value with the next state or value of the I/O pad to determine if the particular I/O pad is transitioning or not. If the values at the inputs to the exclusive OR gate 50 are different (i.e. transitioning), the output 52 will be logical ONE. As will now be described, output 50 is used to turn off the respective pad drivers (during phase 1 and 2) for a pad that is transitioning, and to turn on the respective transmission gates (during phase 2) for a pad that is transitioning.

The pad driver control signals 310, 410, 510, 610, 311, 411, 511 and 611 are generated as shown by signals 710 and 711 in FIG. 3. There are two 2-1 multiplexors shown at 56 and 58. The A input of each multiplexor is coupled to the desired next state (value) 40 for the appropriate I/O pad 13. The B input for multiplexor 56 is indirectly coupled to the next state 40 of I/O pad 13 through AND gate 60. Thus, the next state 40 is only coupled to the B input of multiplexor 56 when phase 3 clock is active (logical ONE). The B input for multiplexor 58 is indirectly coupled to the next state 40 for I/O pad 13 through OR gate 62. The other input of OR gate 62 is coupled to an inverted signal 64 of the phase 3 clock 46. Thus, either the next value 40 or the inverted phase 3 value is coupled to the B input of multiplexor 58. As will be described below, the use of gates 60 and 62 allows for disabling the pad drivers during phase 1 and phase 2.

Selection between the A and B inputs of multiplexors 56 and 58 is controlled by the output 52 of exclusivve-OR gate 50. When the present (i.e. first) and next (i.e. second) state of the respective I/O pad is the same (i.e. not transitioning), the A input is selected (signal 52 is LOW). When the present and next state of the respective I/O pad is different (i.e. transitioning), the B input is selected (signal 52 is HIGH). Outputs 10 and 11 are each coupled to the respective inverted output $\overline{Q}$ for multiplexors 56 and 58. These outputs 710 and 711 are also coupled to the gates of the respective pad driver transistor pairs 314, 414, 514 and 614 of FIG. 2.

With respect to AND gate 60 and OR gate 62, these gates ensure that when the I/O pad is to change values (i.e. transition), the outputs 10 and 11 remain in their inactive states until the phase 3 clock goes to a logical ONE (i.e. active). This ensures that the pad drivers do not drive the I/O pad until the phase 3 time period. With respect to AND gate 60, the output of such gate remains LOW when phase 3 clock is LOW. Hence, when the SEL input to multiplexor 56 is HIGH (indicating a transitioning I/O pad value), the B input of logical ZERO will result in output 10 of multiplexor 56 being a logical ONE. Since this output 10 is coupled to the gate of transistor 25, transistor 25 remains inactive when the phase 3 clock is LOW (i.e. inactive). With respect to OR gate 62, the output of such gate remains HIGH when phase 3 clock is LOW, since the phase 3 clock passes through inverter 66. Hence, when the SEL input to multiplexor 58 is HIGH (indicating a transitioning I/O pad value), the B input of logical ONE will result in output 11 being a logical ZERO. Since this output 11 of multiplexor 58 is coupled to the gate of transistor 27, transistor 27 remains inactive when the phase 3 clock is LOW (i.e. inactive). Thus, during phase 1 and phase 2 (i.e. an inactive phase 3 clock signal), the pad driver for a transitioning I/O pad is turned off or disabled.

Output 52, which as previously described indicates a transitioning I/O pad when at a logical ONE value, is also coupled to AND gate 54. Signal 35 will thus go to a logical ONE value concurrent with an active (logical ONE) signal on phase 2 clock 44 and a transitioning value for the particular I/O pad. Similarly, output signal 33 will go to a logical ZERO value concurrent with an active signal on phase 2 clock 44 and a transitioning value for the particular I/O pad. Signals 733 and 735 are used to selectively enable/disable respective transmission gates 334, 434, 534 and 634 of FIG. 2. Since a logical ZERO for signal 733 and a logical ONE for signal 735 enables both of transistors (e.g. 332 and 334) of a respective transmission gate transistor pair (e.g. 335), the transitioning I/O pad is connected to charge sharing line 36 during an active (logical ONE) phase 2 clock. When a plurality of control circuits such as circuit 38 are operated in parallel, each operating to control a particular I/O pad subsystem, an active phase 2 clock results in all transitioning I/O pads being commonly connected to the charge sharing line 36 through their respective transmission gate. As will be shown below in the examples, the deactivation of phase 2 clock 44 deactivates the transmission gate, and hence decouples or disconnects the output from the charge sharing line 36. In the preferred embodiment, this deactivation occurs at the end of phase 2, but could similarly occur at the beginning of phase 3.

In a similar fashion to that described above with respect to disabling of the respective pad driver during phase 1 and phase 2 by gates 60 and 62, these same gates allow selective activation of the respective pad driver during phase 3. When phase 3 clock 46 is active (logical ONE), the next state 40 will be passed on through AND gate 60 to input B of multiplexor 56, and through OR gate 62 to input B of multiplexor 58. Thus, outputs 710 and 711 are controlled by the desired next state 40 value when phase 3 clock is active.

Examples for controlling I/O pad drivers 314, 414, 514 and 614 of FIG. 2 with the control circuit of FIG. 3 will now be described. For the following examples, it should be noted that a logical ZERO signal at 10 will enable transistor 25 of FIG. 2 and couple voltage Vdd to the I/O pad 13. In similar fashion, a logical ONE at 11 will enable transistor 27 of FIG. 2 and couple a ground voltage to the I/O pad 13. The first example assumes that the present and next state of a particular I/O pad n is the same (i.e. not transitioning). As previously described with reference to FIG. 3, and non-transitioning I/O pad value will result in the A input being selected for both of multiplexors 56 and 58. If the next (and current) state 40 of the I/O pad is a logical ONE, outputs 710 and 711 will both be a logical ZERO (since the inverted output Q* is being used). A logical ZERO for both of signals 10 and 11 will result in transistor n25 being enabled and transistor n27 being disabled. Thus, I/O pad n is driven to Vdd volts (logical ONE). If the next (and current) state 40 of the I/O pad is a logical ZERO, outputs 710 and 711 will both be a logical ONE. A logical ONE for both of signals 710 and 711 will result in transistor n25 being disabled and transistor n27 being enabled. Thus, I/O pad n is driven to a ground voltage (logical ZERO).

The next examples show what happens when the value at the I/O pad transitions from one value to another value. As previously described with reference to FIG. 3, a transitioning value for a particular I/O pad n results in the B inputs of multiplexors 56 and 58 being selected. The B inputs each have a logic gate preceding it (gates n60 and n62), and each logic gate is partially controlled by the phase 3 clock. Hence, the following examples will incorporate a discussion of the timing signals shown in FIG. 4.

FIG. 4 shows the system clock 42, phase 2 clock 44 and phase 3 clock 46, and how these clocks are used to define the time periods for phase 1, phase 2 and phase 3. Phase 1 is the time period between the inactivation of a preceding phase 3 clock and the activation of the phase 2 clock. Phase 2 is the time period between the activation of the phase 2 clock and the activation of the phase 3 clock. Phase 3 is the time period between the activation of the phase 3 clock and the deactivation of the phase 3 clock. The exact starting and stopping times for these phases is not critical to the invention, and can be changed so long as the timing rules described below are maintained. For example, phase 1 could end at the rising edge 70 of system clock 42 and not impact system operation. Phase 1 could also start at the rising edge 70 of system clock 42 and not impact system operation. Yet another possibility is that the activation of the phase 3 clock be significantly delayed with respect to the falling edge 74 of the phase 2 clock 44. Other modifications are also possible, and the present invention is intended to cover such modifications. The system clock 42 is used to clock register 48 in order to maintain the previous state of the I/O pad. This register 48 is clocked when the system clock is a logical ZERO. Phase 2 clock 44 is HIGH (logical ONE) during the charge sharing phase, and phase 3 clock 46 is HIGH when the pad drivers are driving the particular I/O pad n. The only timing constraints between the clocks of FIG. 4 is that the phase 2 and phase 3 clocks be non-overlapping, and that the time extent of phase 2 and phase 3 is contained within one system clock cycle. The generation of the timing signals shown in FIG. 4 in order to comply with the above described rules is commonly known in the art, using standard digital circuitry or microcontroller programming techniques, and need not be further described herein.

For the first transitioning example, assume that the particular I/O pad n is transitioning from a logical ZERO to a logical ONE. The Q output of register 48 (FIG. 3), which is the present state of the particular I/O pad, is a logical ZERO, and the next state input 40 is a logical ONE. After the system clock 42 goes to a logical ONE at 70 of FIG. 4 (thus clocking the present value of I/O pad into register 48), the desired next state 40 for the I/O pin is presented at the D input of register 48. Phase 2 clock 44 then goes active at 72 of FIG. 4. As previously described with reference to FIG. 3, when phase 2 clock 44 is a logical ONE, output 52 of comparator 50 is gated to output 35. Since the I/O pad n is changing values, output 52 is a logical ONE. Hence, signal 735 is a logical ONE and signal 733 is a logical ZERO during an active phase 2 clock. The respective transmission gate of FIG. 2 is thus activated, and the voltage on that particular I/O pad n13 is coupled to the charge sharing line 36 of FIG. 2. When the phase 2 clock 44 goes LOW at 74 (FIG. 4), output 735 goes LOW and output 733 goes HIGH. The respective transmission gate n30 is thus deactivated, and the voltage on that particular I/O pad n13 is decoupled from the charge sharing line 36 (FIG. 2). When phase 3 clock 46 goes HIGH at 78, the next state 40 value is coupled through AND gate 60 to the B input of multiplexor 56. Hence, output 710 will be the inverse of next state 40 during an active phase 3 clock 46. Since this example assumes a LOW to HIGH transition, the next state 40 value is a logical ONE, and output 10 is a logical ZERO. Thus, the gate for the respective transistor n25 is active (i.e. LOW). Likewise when phase 3 clock 46 goes HIGH at 78, the next state value 40 is coupled through OR gate 62 to the B input of multiplexor 58. Hence, output 711 will also be the inverse of next state 40 during an active phase 3 clock 46. The gate for the respective transistor n27 is inactive (i.e. LOW), allowing active transistor n25 to drive signal n12 to Vdd volts. Finally, there is a minimal discrete time period (not shown) between phase 2 clock 44 going inactive at 74 and phase 3 clock 46 going active at 78, in order to ensure that the phase 2 and phase 3 clocks do not overlap.

For an I/O pad transitioning from HIGH to LOW, the control and clocking described above is essentially the same for phase 2 and phase 3. During phase 3, outputs 710 and 711 will both be HIGH (since the next state value 40 is LOW). Thus, for a HIGH to LOW transition, transistor n25 of the respective pad driver n14 will be inactive, and transistor n27 of the respective pad driver n14 will be active. Signal n12 and I/O pad n13 will thus be driven to a logical ZERO during phase 3.

I have described a charge sharing scheme for use with I/O pads and drivers. Similar charge sharing approaches could also be used for internal logic (i.e. logic other than I/O pads and drivers). However, the delay introduced by the required two-phase charge transfer scheme would have to be accounted for, and may not be desirable for every type of situation. Since there are a small number of pads in an integrated circuit chip when compared to the number of overall logic gates in the chip, and the I/O pads use a large portion of the overall power dissipated in the chip, the additional hardware and delay overhead introduced by the present invention is generally more acceptable than it would be for internal chip logic. However, the same techniques can be used for such internal logic without departing from the spirit and essence of the present invention.

These same techniques taught herein can also be used for discrete electrical devices, where additional hardware and delay are not as much an issue as with internal digital logic. In effect, any plurality of electrical signals can be temporarily commonly connected to share charge and hence reduce the overall power required to transition from one voltage level to another voltage level.

While the present invention has been described and illustrated in detail, it is understood that the same is by way of illustration and example only, and is not to be taken as a limitation, the spirit and scope of the present invention being limited only by the terms of the appended claims.

What is claimed is:

1. A system for minimizing power dissipation, comprising:
   a plurality of circuits having outputs which from time to time transition between different voltage levels;
   means for coupling together at least a portion of the outputs which are about to transition, while maintaining discontinuity between at least a portion of the outputs which are not about to transition.

2. The system of claim 1 wherein said circuits are integrated circuits embodied on a semiconductor substrate.

3. The system of claim 1 where said circuit comprises CMOS field-effect transistors.

4. The system of claim 1 further comprising:
   means for decoupling at least one of said coupled outputs; and
   means for operating at least one of said plurality of circuits to drive at least one of said decoupled outputs to a subsequent voltage level.

5. The system of claim 4 further comprising a control circuit for sequencing said means for coupling, said means for decoupling and said means for operating.

6. The system of claim 1 wherein a low to high voltage transitioning output is precharged by a high to low voltage transitioning output.

7. A method for minimizing power consumption, comprising the steps of:
   transferring charge between a plurality of circuits by connecting a plurality of transitioning circuit outputs together while maintaining discontinuity between non-transitioning circuit outputs;
   disconnecting at least one of said plurality of transitioning circuit outputs; and
   driving said at least one disconnected output to a subsequent voltage level.

8. The method of claim 7 wherein charge is transferred from a circuit output having a higher voltage to a circuit output having a lower voltage.

9. A method for minimizing power consumption comprising the step of precharging a circuit output by connecting a plurality of transitioning circuit outputs together while maintaining discontinuity between non-transitioning circuit outputs.

10. The method of claim 9 in which at least one circuit output is transitioning from a high voltage to a low voltage, and at least one circuit output is transitioning from a low voltage to a high voltage.

11. The method of claim 10 in which said low to high voltage transitioning output is precharged by said high to low voltage transitioning output.

12. A system for minimizing power consumption, comprising:
   means for transferring charge between a plurality of transitioning circuit outputs while maintaining discontinuity between a plurality of non-transitioning circuit outputs; and
   means for driving at least one of said transitioning circuit outputs to a subsequent voltage level.

13. A system for minimizing power consumption, comprising:
   a first plurality of circuit outputs which transition between differing voltage levels during time T1 (transitioning outputs);
   a second plurality of circuit outputs which do not transition between differing voltage levels during time T1 (non-transitioning outputs);

means for precharging at least one of said first circuit outputs by connecting a plurality of said transitioning circuit outputs together while maintaining discontinuity between said non-transitioning outputs.

14. The system of claim 13 in which a low to high voltage transitioning output is precharged by a high to low voltage transitioning output.

15. A method for minimizing power consumption in a system having a plurality of circuits and circuit outputs, comprising the steps of:

maintaining a first state of at least a portion of said circuit outputs;

comparing said first state with a second state of said portion of circuit outputs to determine transitioning outputs;

coupling at least a portion of said transitioning outputs together;

decoupling at least a portion of said coupled outputs; and operating at least one of said circuits to drive at least one of said decoupled outputs to said second state.

16. A method for minimizing power dissipation, comprising the steps of:

coupling a first output of a first pad driver circuit to a second output of a second pad driver circuit during a first time period;

decoupling said first and second outputs during a second time period; and operating at least one of said first and second pad driver circuits to drive at least one of said first and second outputs to a subsequent voltage level during a third time period.

17. A system for minimizing power consumption in a system having a plurality of circuits and circuit outputs, comprising:

a memory for maintaining a first state of at least a portion of said circuit outputs;

means for comparing said first state with a second state of said portion of circuit outputs to determine transitioning outputs; and switching means for coupling and decoupling said transitioning outputs.

18. The system of claim 17 further comprising means for operating at least one of said circuits to drive at least one of said transitioning outputs to said second state.

19. A method for operating a circuit having a plurality of outputs, where the outputs transition between different voltage levels, comprising the steps of:

determining which of the plurality of outputs are about to transition; and selectively coupling together at least some of the about to transition outputs.

20. In combination:

an integrated circuit having a plurality of outputs; and means for selectively coupling at least some of the plurality of outputs based upon whether the outputs are about to transition.

* * * * *

UNITED STATES PATENT AND TRADEMARK OFFICE
CERTIFICATE OF CORRECTION

PATENT NO. : 5,574,633

DATED : November 12, 1996

INVENTOR(S) : James S. Prater

It is certified that error appears in the above-identified patent and that said Letters Patent is hereby corrected as shown below:

Title Page, after "Assignees:" delete "AT&T Global Information Solubions Company" and insert --AT&T Global Information Solutions Company --.

Signed and Sealed this

Third Day of June, 1997

Attest:

BRUCE LEHMAN

*Attesting Officer*  *Commissioner of Patents and Trademarks*